United States Patent
Chilcott

(10) Patent No.: US 7,303,936 B2
(45) Date of Patent: Dec. 4, 2007

(54) METHOD FOR FORMING ANTI-STICTION BUMPS ON A MICRO-ELECTRO MECHANICAL STRUCTURE

(75) Inventor: Dan W. Chilcott, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 353 days.

(21) Appl. No.: 11/105,152

(22) Filed: Apr. 13, 2005

(65) Prior Publication Data
US 2006/0234413 A1    Oct. 19, 2006

(51) Int. Cl.
*H01L 21/00* (2006.01)

(52) U.S. Cl. .................. 438/50; 257/E21.016
(58) Field of Classification Search .......... 438/50; 257/E21.017
See application file for complete search history.

(56) References Cited

U.S. PATENT DOCUMENTS 6,930,366 B2 *  8/2005  Kiihamaki ................. 257/414

* cited by examiner

*Primary Examiner*—Scott B. Geyer
*Assistant Examiner*—Elias Ullah
(74) *Attorney, Agent, or Firm*—Jimmy L. Funke

(57) ABSTRACT

A technique for forming anti-stiction bumps on a bottom surface of a micro-electro mechanical (MEM) structure includes a number of process steps. The MEM structure is fabricated from an assembly that includes a support substrate bonded to a single-crystal semiconductor layer, via an insulator layer. A plurality of holes are formed through the single-crystal semiconductor layer to the insulator layer on an interior portion of a defined movable structure. A portion of the insulator layer underneath the holes is removed. The holes are then filled with a conformal film that extends below a lower surface of the defined movable structure to provide a plurality of anti-stiction bumps. A trench is then formed through the single-crystal semiconductor layer to the insulator layer to form the defined movable structure. Finally, a remainder of the insulator layer underneath the defined movable structure is removed to free the defined movable structure.

12 Claims, 3 Drawing Sheets

METHOD FOR FORMING ANTI-STICTION BUMPS ON A MICRO-ELECTRO MECHANICAL STRUCTURE

TECHNICAL FIELD

The present invention is generally directed to a method for forming anti-stiction bumps and, more specifically, to a method for forming anti-stiction bumps on a bottom surface of a micro-electro mechanical structure.

BACKGROUND OF THE INVENTION

Microstructure stiction frequently occurs in micro-electro mechanical (MEM) devices due to wet chemical processing of the microstructure. Typically, stiction occurs when surface adhesion forces are higher than the mechanical restoring force of the microstructure. For example, stiction may occur after wet etching of an underlying sacrificial layer, when a liquid meniscus formed on hydrophilic surfaces of the microstructure pull the microstructure toward an associated substrate. Usually, such stiction problems may be alleviated by a dry hydrofluoric (HF) etching or supercritical carbon dioxide ($CO_2$) drying.

A more difficult problem to address is in-use stiction, which occurs during operation when components of the microstructure come into contact, intentionally or accidentally. In-use stiction may be caused by capillary forces, electrostatic attraction and/or direct chemical bonding. Developers have used alternative process, such a bulk micromachining, to decrease the chance of in-use stiction. However, these processes are generally less capable and versatile than surface micromachining, in terms of device function. However, even bulk micromachined MEM devices may still experience in-use stiction.

One approach to address the in-use stiction problem associated with MEMs structures has been to provide a low-energy surface coating, in the form of an organic passivation layer, on the inorganic surfaces of the microstructures. In general, such coatings can eliminate or reduce capillary forces and direct chemical bonding, as well as reduce electrostatic forces. For example, Texas Instruments has utilized a fluorinated fatty acid self-assembled monolayer (SAM) on an aluminum oxide surface in their digital micro-mirror device (DMD). As another example, Analog Devices has coated the surface of their inertia sensors using thermal evaporation of silicone polymeric materials at the packaging stage, after the device is completely released. Another approach has utilized the formation of siloxan SAMs on the oxide terminated surface of the microstructures. However, the use of siloxan SAMs is difficult to implement because of the chemistry and, as such, its poor reproducibility limits its practical usage. Furthermore, experimental evidence has shown that wear-resistance films, such as SAM coatings, are removed during the operation of the MEM device. In addition, many organic layers have a limited lifetime or decrease the allowable operating temperature of the device.

Another technique for addressing in-use stiction in MEM devices has been to form stiction bumps in a polysilicon surface. In this technique, the stiction bumps are formed in the polysilicon surface of the micromachined structure by patterning the surface of a sacrificial layer. Thus, when the polysilicon is deposited, it takes on the shape of the patterned layer forming a bump, when the sacrificial layer is removed. However, this technique cannot be utilized for silicon-on-insulator (SOI) wafer based MEM devices, as the sacrificial layer is part of the SOI wafer.

What is needed is a technique for forming bumps on a surface of a movable micro-electro mechanical structure that is fabricated in an assembly, e.g., a silicon-on-insulator wafer, having an internal sacrificial layer.

SUMMARY OF THE INVENTION

The present invention is generally directed to a method for forming anti-stiction bumps on a bottom surface of a micro-electro mechanical (MEM) structure. In general, the method is implemented on an assembly that includes a support substrate that is bonded to a single-crystal semiconductor layer, via an insulator layer. A plurality of holes are formed through the single-crystal semiconductor layer to the insulator layer on an interior portion of a defined movable structure. A portion of the insulator layer underneath the holes is removed. The holes are then filled with a conformal film that extends below a lower surface of the defined movable structure to provide a plurality of anti-stiction bumps. A trench is then formed through the single-crystal semiconductor layer to the insulator layer to form the defined movable structure. Finally, a remainder of the insulator layer underneath the defined movable structure is removed to free the defined movable structure.

According to another embodiment of the present invention, the conformal film is a polysilicon. According to another aspect of the present invention, the trench is formed using a deep reactive ion etch (DRIE). According to a different embodiment of the present invention, the holes are also formed using a DRIE. According to a different embodiment of the present invention, the insulator layer is an oxide layer. The insulator layer may be removed with a dry oxide etch or a wet oxide etch. In general, the semiconductor is a silicon material. That is, the support substrate is a single-crystal silicon wafer, the single-crystal semiconductor layer is a single-crystal silicon layer and the insulator layer is an oxide layer.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

According to one embodiment of the present invention, a micro-electro mechanical (MEM) device is fabricated from a silicon-on-insulator (SOI) wafer, which includes a support substrate, e.g., a single-crystal silicon substrate, bonded to a single-crystal semiconductor layer via an insulator layer, e.g., an oxide layer. One or more trenches (holes) are etched, e.g., with a deep reactive ion etch (DRIE), through a defined movable structure of the MEM device until the holes reach the oxide interface of the SOI wafer. A dry or wet oxide etch is then performed to partially remove the oxide underneath the holes. Next, a conformal film, such as a polysilicon, is used to fill the holes, including the region at the bottom of the holes, where the oxide was removed. A remainder of the oxide layer, underneath the defined movable structure, is removed during an undercut step to free the movable structure. As such, the conformal film, which extends below a lower surface of the movable structure, provides anti-stiction bumps that reduce an area that may contact a surface of the support substrate.

Figure 1:
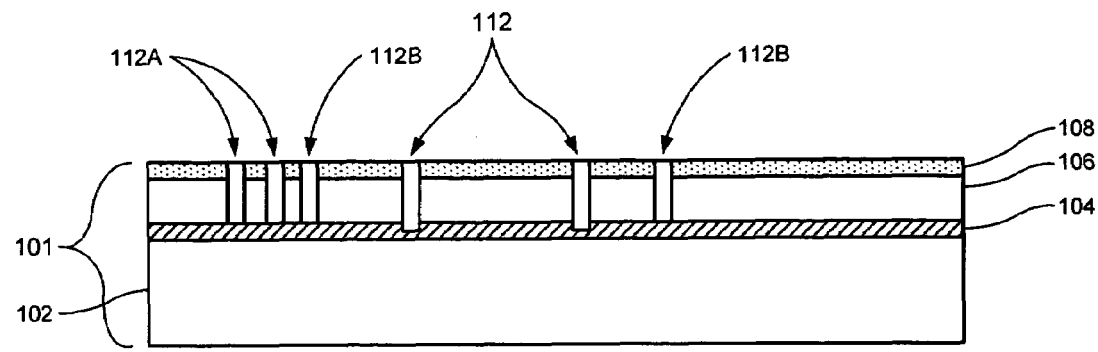
FIGS. 1-4 are cross-sectional views of a silicon-on-insulator (SOI) wafer, along the line A-A of FIG. 5, during various processing steps implemented according to the present invention to form a micro-electro mechanical (MEM) structure.
Figure 3:
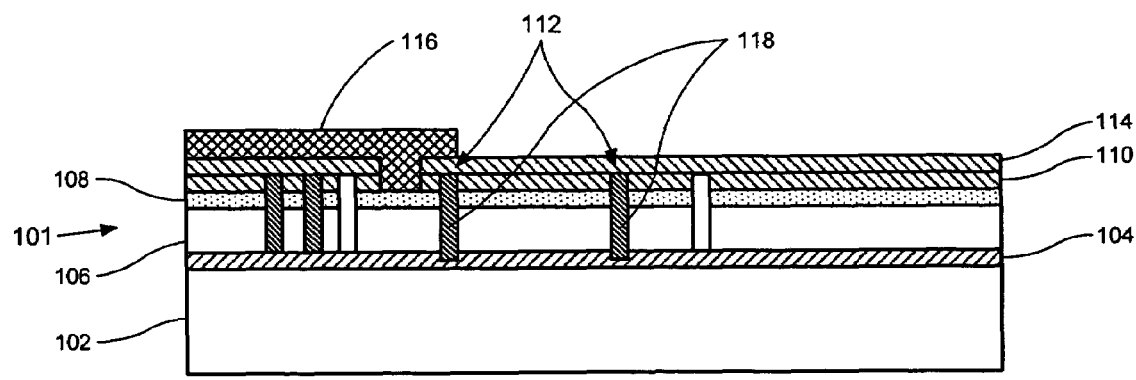
Figure 4:
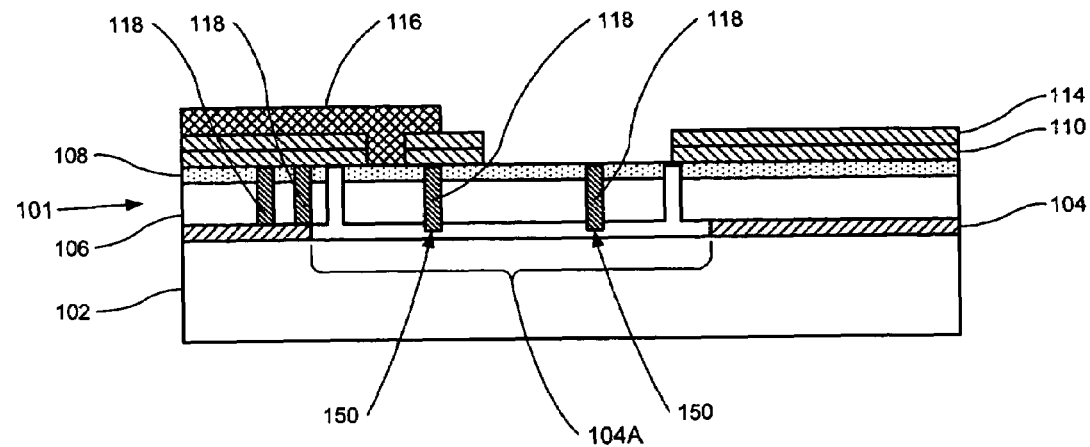
Figure 5:
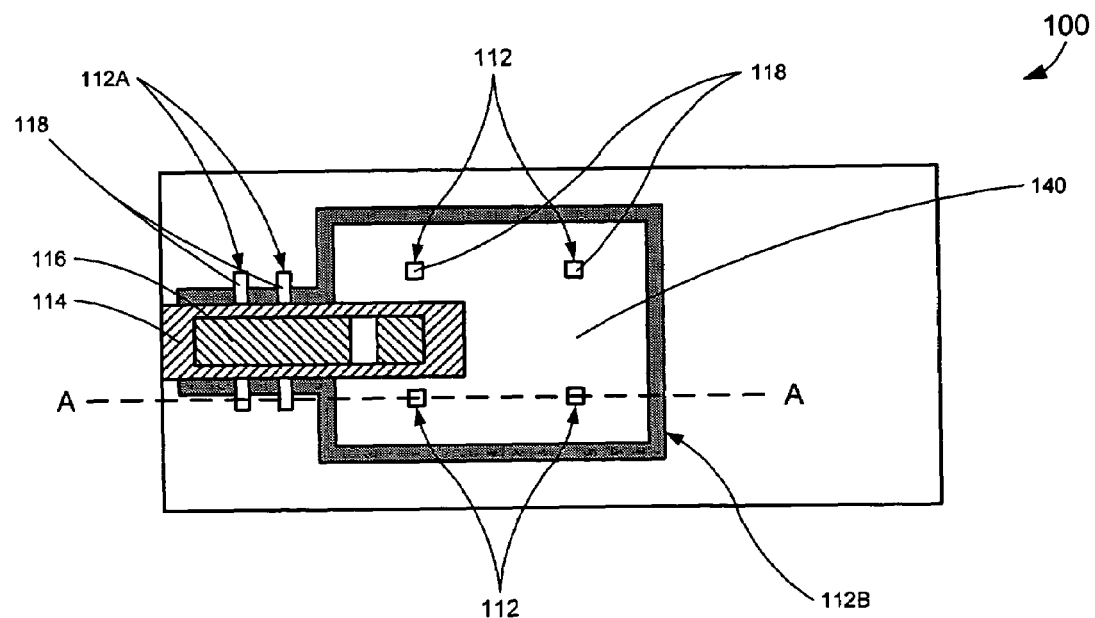
FIG. 5 is a top view of the SOI wafer of FIG. 4.

FIGS. 1-4 depict cross-sectional views of an exemplary micro-electro mechanical (MEM) device 100, along the line A-A of FIG. 5, during various fabrication steps. With reference to FIG. 1, an SOI wafer 101 includes a support substrate 102 that is bonded to a single-crystal semiconductor layer 106, via an insulator layer 104. As is shown, a P+ implant layer 108 has been implanted into the layer 106. Additionally, a plurality of trenches 112, 112A and 112B have been formed through the layer 106 to the oxide layer 104. Specifically, the trenches 112A are formed to isolate a defined movable structure 140 that is to be formed, the trenches 112B define the movable structure 140 (see FIG. 5) and the trenches (holes) 112 are formed through the layer 106 and partially into the oxide layer 104 at an interior of the structure 140.

Figure 2:
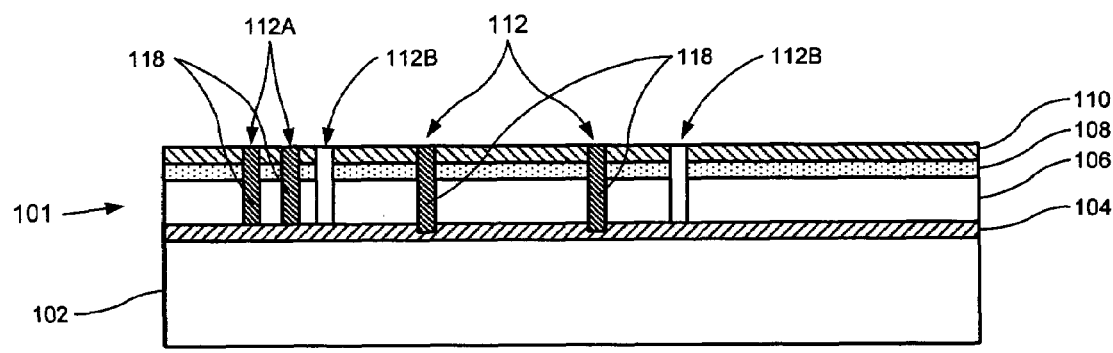

As is shown in FIG. 2, the holes 112 are filled with a conformal film 118, which extends below a lower surface of the layer 106. Likewise, the isolation trenches 112A are filled with the conformal film 118. A variety of materials may be utilized to for the conformal film 118. For example, the film 118 may be a polysilicon. With reference to FIG. 3, an oxide layer 114 is formed over oxide layer 110. A metal layer 116 extends through portions of the oxide layers 110 and 114 to provide appropriate contacts to the layer 106. With reference to FIG. 4, stiction bumps 150, which are formed from the conformal film 118, are shown extending below the layer 106. As is shown, the oxide layer 104 is removed in area 104A beneath the movable structure 140.

Figure 6:
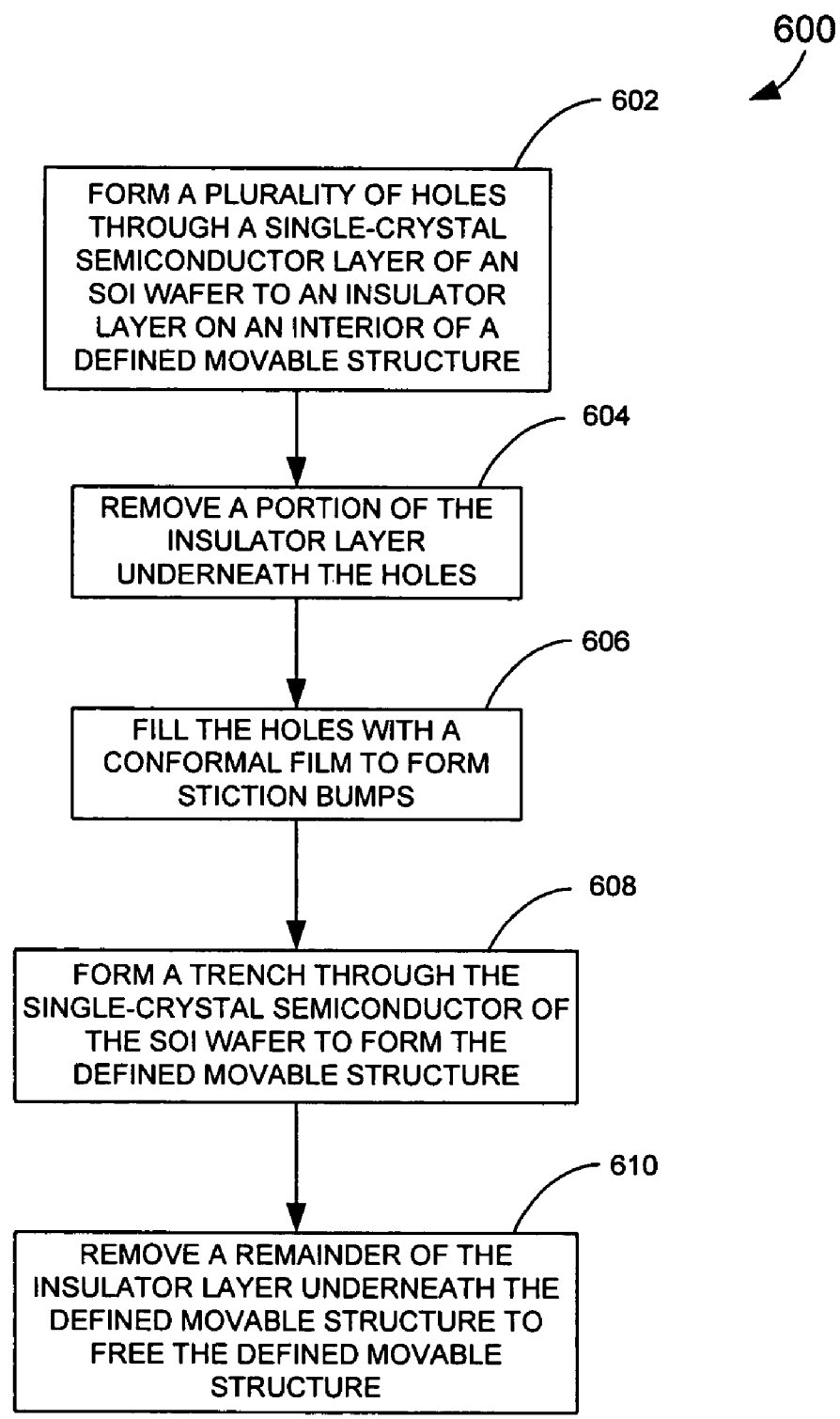
FIG. 6 is an exemplary process flowchart of a process for forming anti-stiction bumps on a bottom surface of the MEM structure, according to the present invention.

With reference to FIG. 6, a flow chart of an exemplary process 600 for forming anti-stiction bumps on a bottom surface of a micro-electro mechanical (MEM) structure, according to one embodiment of the present invention, is depicted. In step 602, a plurality of holes (trenches) 112 (and 112A) are formed through a single-crystal semiconductor layer 106 (of SOI wafer 101) to the insulator layer 104 (of the SOI wafer 101) on an interior of a defined movable structure 140. It should be appreciated that the plurality of holes (trenches) 112 (and 112A) may be formed in separate steps or a single step. Then, in step 604, a portion of the insulator layer 104, underneath the holes 112, is removed. Next, in step 606, the holes 112 and 112A are filled with a conformal film 118 to form stiction bumps 150 and to provide isolation trenches. Then, in step 608, a trench 112B is formed through the single-crystal semiconductor 106 of the SOI wafer 101 to form the defined movable structure 140. Then, in step 610, a remainder of the insulator layer 104, underneath the defined movable structure 140, is removed to free the defined movable structure 140.

It should be appreciated that a process for forming anti-stiction bumps on a bottom of the surface of a micro-electro mechanical (MEM) structure formed from a silicon-on-insulator (SOI) wafer may include a number of processes. For example, initially, a thermal oxide layer may be formed on an upper surface of the layer 106. The oxide layer may then be masked and the layer 108 may then be implanted into the layer 106 in a desired pattern. Following the implantation of the layer 108, the oxide may be stripped and the wafer 101 may then be masked for the isolation trenches 112A and holes 112. The isolation trenches 112A and the holes 112 may be formed, for example, with a deep reactive ion etch (DRIE). Following the DRIE, the wafer 101 may be cleaned (e.g., a descum operation is performed) and an oxide etch may then be initiated to allow for the formation of the stiction bump 150. Next, a thermal oxide layer may be deposited on the wafer 101 and a conformal film 118 may then be deposited in the trenches 112A and the holes 112, which are formed in the defined movable structure 140. The conformal film 118 may be, for example, achieved by a polysilicon deposition, followed by a blanket polysilicon etch, which may then be followed by the formation of a thermal or Novellus oxide layer.

Next, the oxide layer may be masked and etched to provide contact windows in the oxide layer. Then, a metal, such as aluminum, may be deposited onto the wafer 101 to interconnect the various electrical components. After a mask and etch step of the aluminum, a window may be masked and etched into the oxide layers in preparation for formation of the movable structure 140. Then, the movable structure 140 may be formed with a DRIE etch. Following this step, the wafer 101 may be cleaned and an oxide layer 104, underneath the movable structure 140, may be removed by, for example, a wet etch undercut.

Accordingly, a micro-electro mechanical (MEM) structure and a process for forming the MEM structure from a silicon-on-insulator (SOI) wafer have been described herein. The MEM structure includes anti-stiction bumps that reduce the likelihood of the occurrence of stiction in the MEM structure.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. A method for forming anti-stiction bumps on a bottom surface of a micro-electro mechanical (MEM) structure, comprising the steps of:
   providing an assembly, wherein the assembly includes a support substrate bonded to a single-crystal semiconductor layer via an insulator layer;
   forming a plurality of holes through the single-crystal semiconductor layer to the insulator layer on an interior portion of a defined movable structure;
   removing a portion of the insulator layer underneath the holes;
   filling the holes with a conformal film, wherein the conformal film extends below a lower surface of the defined movable structure to provide a plurality of anti-stiction bumps;
   forming a trench through the single-crystal semiconductor layer to the insulator layer to form the defined movable structure; and
   removing a remainder of the insulator layer underneath the defined movable structure to free the defined movable structure.

2. The method of claim 1, wherein the conformal film is polysilicon.

3. The method of claim 1, wherein the trench is formed using a deep reactive ion etch (DRIE).

4. The method of claim 1, wherein the holes are formed using a deep reactive ion etch (DRIE).

5. The method of claim 1, wherein the insulator layer is an oxide layer.

6. The method of claim 5, wherein the insulator layer is removed with a dry oxide etch or a wet oxide etch.

7. The method of claim 1, wherein the semiconductor is silicon.

8. The method of claim 1, wherein the support substrate is a single-crystal silicon wafer, the single-crystal semiconductor layer is a single-crystal silicon layer and the insulator layer is an oxide layer.

9. A method for forming anti-stiction bumps on a bottom surface of a micro-electro mechanical (MEM) structure, comprising the steps of:

providing an assembly, wherein the assembly includes a support substrate bonded to a single-crystal semiconductor layer via an insulator layer;

forming a plurality of holes through the single-crystal semiconductor layer to the insulator layer on an interior portion of a defined movable structure;

removing a portion of the insulator layer underneath the holes;

filling the holes with a conformal film, wherein the conformal film extends below a lower surface of the defined movable structure to provide a plurality of anti-stiction bumps;

forming a trench through the single-crystal semiconductor layer to the insulator layer to form the defined movable structure; and removing a remainder of the insulator layer underneath the defined movable structure to free the defined movable structure, wherein the support substrate is a silicon wafer, the single-crystal semiconductor layer is a single-crystal silicon layer and the insulator layer is an oxide layer.

10. The method of claim 9, wherein the conformal film is polysilicon.

11. The method of claim 9, wherein the trench is formed using a deep reactive ion etch (DRIE) and the holes are formed using another DRIE.

12. The method of claim 9, wherein the insulator layer is removed with a dry oxide etch or a wet oxide etch.

* * * * *